(12) United States Patent
Tanio

(10) Patent No.: US 9,106,188 B2
(45) Date of Patent: Aug. 11, 2015

(54) AMPLIFYING DEVICE AND METHOD FOR CONTROLLING THE SAME

(75) Inventor: Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 86 days.

(21) Appl. No.: 13/993,893

(22) PCT Filed: Dec. 16, 2011

(86) PCT No.: PCT/JP2011/079971
§ 371 (c)(1),
(2), (4) Date: Jun. 13, 2013

(87) PCT Pub. No.: WO2012/086830
PCT Pub. Date: Jun. 28, 2012

(65) Prior Publication Data
US 2013/0257531 A1    Oct. 3, 2013

(30) Foreign Application Priority Data

Dec. 20, 2010  (JP) ................................ 2010-283133

(51) Int. Cl.
H03F 1/26 (2006.01)
H03F 1/32 (2006.01)
H03F 1/02 (2006.01)
H03F 3/24 (2006.01)

(52) U.S. Cl.
CPC ............... *H03F 1/3288* (2013.01); *H03F 1/02* (2013.01); *H03F 1/0211* (2013.01); *H03F 1/3247* (2013.01); *H03F 3/24* (2013.01); *H03F 2201/3233* (2013.01)

(58) Field of Classification Search
CPC ................................ H03F 1/02; H03F 1/3288
USPC ................. 330/149; 375/296–297; 455/114.3
See application file for complete search history.

(56) References Cited

U.S. PATENT DOCUMENTS 7,535,310 B2 *   5/2009   Shimizu et al. ............... 332/103

FOREIGN PATENT DOCUMENTS

| JP | 2006-502599 A | 1/2006 |
| JP | 2008-177899 A | 7/2008 |

(Continued)

OTHER PUBLICATIONS

International Search Report for PCT Application No. PCT/JP2011/079971 mailed on Mar. 19, 2012.

*Primary Examiner* — Khanh V Nguyen
*Assistant Examiner* — Khiem Nguyen
(74) *Attorney, Agent, or Firm* — Sughrue Mion, PLLC

(57) ABSTRACT

An amplifying device includes a first pre-distorter unit outputting a modulated signal obtained by adding a phase compensation amount and an amplitude adjustment amount to an input signal, a power amplifier inputting the modulated signal and outputting an output signal obtained by amplifying the modulated signal, a power supply voltage modulation unit modulating a power supply voltage, a second pre-distorter unit controlling the power supply voltage modulation unit on the basis of amplitude information on the input signal; and a control unit controlling an operation of the first pre-distorter unit and the second pre-distorter unit, wherein the control unit includes a phase control unit controlling the phase compensation amount by using a phase coefficient, a first amplitude control unit controlling the amplitude adjustment amount by using a first amplitude coefficient, and a second amplitude control unit controlling the operation of the second pre-distorter unit by using a second amplitude coefficient.

20 Claims, 12 Drawing Sheets

(56) References Cited

FOREIGN PATENT DOCUMENTS

| JP | 2010-45508 A | 2/2010 |
| JP | 2010-226190 A | 10/2010 |
| WO | 2008/072700 A1 | 6/2008 |

* cited by examiner

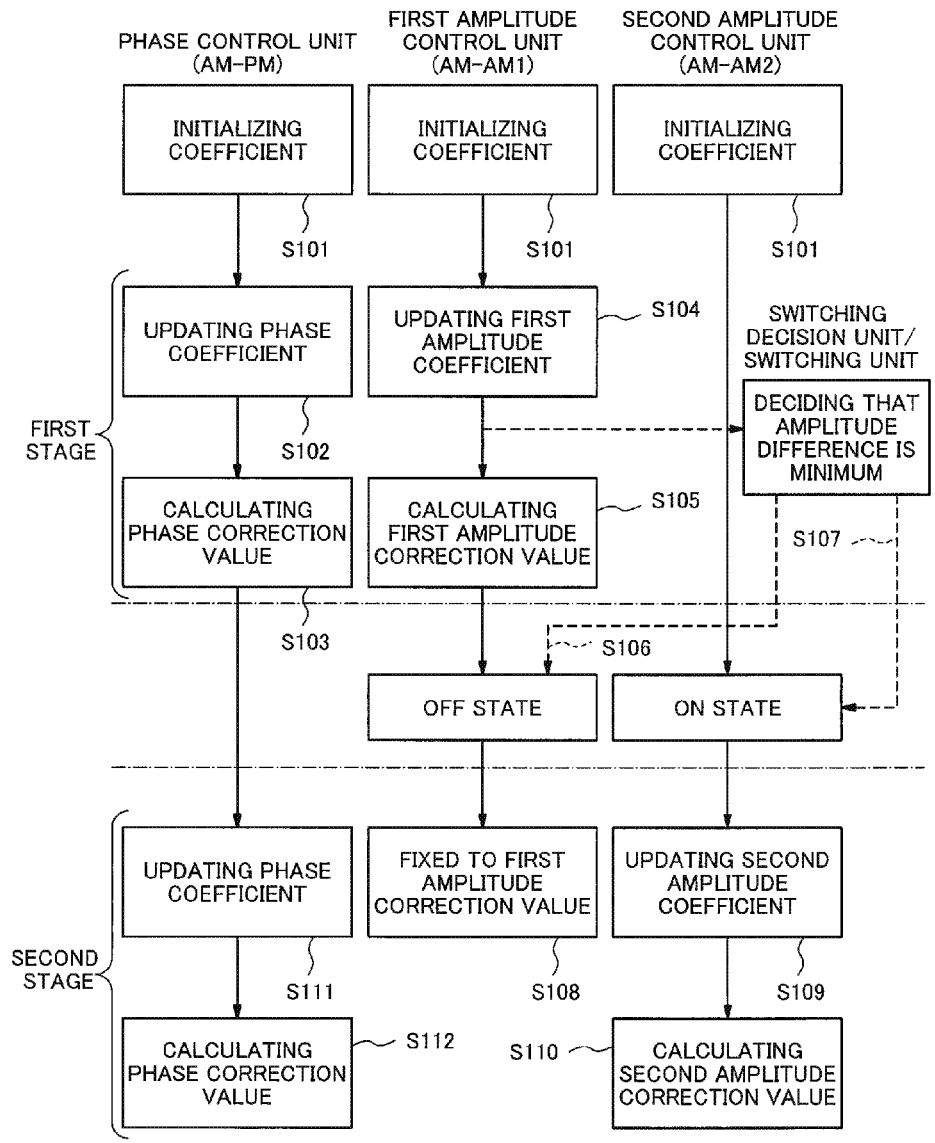

AMPLIFYING DEVICE AND METHOD FOR CONTROLLING THE SAME

This application is a National Stage Entry of PCT/JP2011/079971 filed Dec. 16, 2011, which claims priority from Japanese Patent Application 2010-283133 filed Dec. 20, 2010, the contents of all of which are incorporated herein by reference, in their entirety.

TECHNICAL FIELD

The present invention relates to amplifying devices and methods for controlling the same, in particular, to an amplifying device and a method for controlling the same having highly-efficient and low distortion characteristics.

BACKGROUND ART

In a transmitter used in a base station of a radio communications system, an amplifying device having high power efficiency is required in order to miniaturize the transmitter and reduce its power consumption. As technologies to realize high efficiency of the amplifying device, technologies are known in which the power consumption can be reduced by controlling a power supply voltage depending on an input signal. A particularly effective system of them is an Envelope Tracking system.

The Envelope Tracking system is a system in which a power supply voltage of an amplifier such as a power amplifier and the like is changed depending on the amplitude of an input signal. Since the electric power supplied from a power supply decreases by this system in comparison with driving it by a constant power supply voltage, it becomes possible to amplify signals high efficiently. Here, if an output signal voltage exceeds the power supply voltage of the power amplifier, the linearity between the input signal and the output signal is lost due to the output saturation arising. Therefore, in general, the power supply voltage is designed so that the power supply voltage supplied to the power amplifier may always become higher than the output signal voltage.

Meanwhile, since low distortion characteristics are generally required for the amplifying device used in the transmitter, a distortion compensation system such as Digital Pre-distortion (DPD) system and the like is adopted. The digital pre-distortion system is a system in which the distortion caused by the power amplifier is cancelled by means of preliminarily distorting signals input into the power amplifier composing the amplifying device using a pre-distorter and consequently the low distortion characteristics of the amplifying device are realized. In the digital pre-distortion (DPD) system, a distortion model of the power amplifier is constructed by comparing an input signal and an output signal of the power amplifier, and inverse characteristics of the distortion model are set for the pre-distorter.

Configuration examples of the digital pre-distortion (DPD) system include a system using a look up table (LUT). A correction value corresponding to each of the amplitudes of the input signals has been preliminarily recorded in the look up table (LUT), and the correction value is updated sequentially so that the distortion of the power amplifier may be cancelled. There are two kinds of distortion which are compensated by using the look up table (LUT). One is a distortion due to non-linear characteristics in output amplitude characteristics to input amplitudes of the signal (hereinafter, referred to as "AM-AM characteristics") and another is a distortion due to non-linear characteristics in output phase characteristics to input amplitudes (hereinafter, referred to as "AM-PM characteristics"). By correcting two kinds of distortion mentioned above, signal characteristics between the input signal and the output signal of the amplifying device become a linear relationship and consequently the distortion is suppressed. Here, the look up table (LUT) is not limited to the above-mentioned configuration which separately includes one for correcting the AM-AM characteristics and another for correcting the AM-PM characteristics. A system is also known which configures a look up table (LUT) including complex values by using input-output data stream of complex signals.

Configuration examples of the digital pre-distortion (DPD) system include another system approximating a correction amount of distortion for the power amplifier by using a polynomial. In this case, the non-linear characteristics of the power amplifier are cancelled by calculating coefficient values of the polynomial using the output signal and the input signal of the power amplifier, and by updating the coefficient values sequentially. Another system is also known in which the pre-distorter has filter characteristics, and a memory effect of the power amplifier is suppressed taking the past information into consideration by selecting the number of taps of the filter.

Although each amplifying device individually adopting either the Envelope Tracking system or the digital pre-distortion (DPD) system has been described above, it is also possible to configure an amplifying device which adopts both systems. An example of the above-mentioned amplifying device is disclosed in patent literature 1.

As shown in FIG. 12, a related amplifying device 500 described in patent literature 1 includes a power amplifier 510, a power supply modulation unit 520, a distortion compensation unit 530, a first estimation unit 540, and a second estimation unit 550. The power supply modulation unit 520 supplies the power amplifier 510 with a power supply modulation voltage depending on an input signal, and the distortion compensation unit 530 compensates the distortion in the power amplifier 510. The first estimation unit 540 estimates a first amplifier model which indicates the characteristics of the power amplifier 510 between input and output signals on the basis of the input signal and the output signal of the power amplifier 510. The second estimation unit 550 estimates a second amplifier model which indicates the characteristics of the power amplifier 510 between the power supply modulation voltage and the output signal on the basis of the power supply modulation voltage and the output signal. The distortion compensation unit 530 compensates the distortion of the power amplifier 510 on the basis of the first amplifier model, and the power supply modulation unit 520 controls the power supply modulation voltage on the basis of the second amplifier model.

As mentioned above, in the related amplifying device 500, the distortion compensation unit 530 and the power supply modulation unit 520 control independently the distortion compensation and the power supply modulation voltage on the basis of the first amplifier model and the second amplifier model, each of which is obtained by the estimation unit independently of each other. Therefore, it is said that it becomes possible to control suitably both of power supply modulation characteristics and distortion compensation characteristics depending on the characteristics of the power amplifier 510, and that it is possible to simplify the calculation for carrying out these controls.

Patent Literature 1: Japanese Patent Application Laid-Open Publication No. 2010-045508 (paragraphs [0014] and [0015], and FIG. 3)

DISCLOSURE OF INVENTION

Problem to be Solved by the Invention

It is said that the related amplifying device 500 mentioned above minimizes the distortion characteristics of the amplifying device by means of the distortion compensation unit 530 and maximizes efficiency in the amplifying device by means of the power supply modulation unit 520. However, since the distortion compensation unit 530 and the power supply modulation unit 520 control the distortion compensation and the power supply modulation voltage independently of each other, there is a problem that each of them does not always converge at the optimum point. That is to say, if any one of parameters of the distortion compensation and the power supply modulation voltage is optimized and fixed, then the other parameter is optimized, the characteristics of the power amplifier vary according to the change of the other parameter. Therefore, since the optimum point of the previously-optimized parameter is moved, it is difficult to set both these parameters optimally.

As mentioned above, the related amplifying device has a problem that it is difficult to realize the low distortion characteristics and the highly-efficient operation of the amplifying device simultaneously.

The object of the present invention is to provide an amplifying device and a method for controlling the same which solve the problem mentioned above that it is difficult to realize the low distortion characteristics and the highly-efficient operation of the amplifying device simultaneously.

Means for Solving a Problem

An amplifying device according to an exemplary aspect of the invention includes a first pre-distorter unit outputting a modulated signal obtained by adding a phase compensation amount and an amplitude adjustment amount to an input signal; a power amplifier inputting the modulated signal and outputting an output signal obtained by amplifying the modulated signal; a power supply voltage modulation unit modulating a power supply voltage of the power amplifier; a second pre-distorter unit controlling the power supply voltage modulation unit on the basis of amplitude information on the input signal; and a control unit controlling an operation of the first pre-distorter unit and the second pre-distorter unit; wherein the control unit includes a phase control unit controlling the phase compensation amount by using a phase coefficient, a first amplitude control unit controlling the amplitude adjustment amount by using a first amplitude coefficient, and a second amplitude control unit controlling the operation of the second pre-distorter unit by using a second amplitude coefficient; and wherein the first amplitude control unit cooperates with the second amplitude control unit so that an amplitude amplification factor may become constant which is a ratio of an amplitude of the output signal to an amplitude of the input signal.

A control device for a power amplifier according to an exemplary aspect of the invention includes a first pre-distorter unit outputting, to the power amplifier, a modulated signal obtained by adding a phase compensation amount and an amplitude adjustment amount to an input signal; a second pre-distorter unit controlling the power supply voltage modulation unit on the basis of amplitude information on the input signal; and a control unit controlling an operation of the first pre-distorter unit and the second pre-distorter unit; wherein the control unit includes a phase control unit controlling the phase compensation amount by using a phase coefficient, a first amplitude control unit controlling the amplitude adjustment amount by using a first amplitude coefficient, and a second amplitude control unit controlling the operation of the second pre-distorter unit by using a second amplitude coefficient; and wherein the first amplitude control unit cooperates with the second amplitude control unit so that an amplitude amplification factor may become constant which is a ratio of an amplitude of an output signal of the power amplifier to an amplitude of the input signal.

A method for controlling an amplifying device according to an exemplary aspect of the invention includes the steps of updating a phase coefficient determining a phase compensation amount to an input signal of an amplifying device so that a phase difference between the input signal and an output signal of the amplifying device may be minimized; calculating a phase correction value which is a phase coefficient to minimize the phase difference; generating an input modulated signal by applying to the input signal a function whose output value is equal to or greater than an input value for every input value; updating a first amplitude coefficient determining an amplitude adjustment amount to the input signal so that an amplitude difference between the input modulated signal and the output signal may be minimized; calculating a first amplitude correction value which is the first amplitude coefficient to minimize an amplitude difference between the input modulated signal and the output signal; updating a second amplitude coefficient determining an amplitude of a power supply voltage of a power amplifier composing the amplifying device, under the condition that the first amplitude correction value is kept constant, on the basis of amplitude information on the input signal so as to supply a power supply voltage by which an output of the power amplifier becomes a saturated state; calculating, as a second amplitude correction value, the second amplitude coefficient at a time when an amplitude amplification factor becomes constant which is the ratio of an amplitude of the output signal to an amplitude of the input signal; and compensating phase difference between the input signal and the output signal by using the phase correction value and controlling the amplitude amplification factor to be kept constant by using the first amplitude correction value and the second amplitude correction value.

A program according to an exemplary aspect of the invention which makes a computer execute a procedure for updating a phase coefficient determining a phase compensation amount to an input signal of an amplifying device so that a phase difference between the input signal and an output signal of the amplifying device may be minimized; a procedure for calculating a phase correction value which is a phase coefficient to minimize the phase difference; a procedure for generating an input modulated signal by applying to the input signal a function whose output value is equal to or greater than an input value for every input value; a procedure for updating a first amplitude coefficient determining an amplitude adjustment amount to the input signal so that an amplitude difference between the input modulated signal and the output signal may be minimized; a procedure for calculating a first amplitude correction value which is the first amplitude coefficient to minimize an amplitude difference between the input modulated signal and the output signal; a procedure for updating a second amplitude coefficient determining an amplitude of a power supply voltage of a power amplifier composing the amplifying device, under the condition that the first amplitude correction value is kept constant, on the basis of amplitude information on the input signal so as to supply a power supply voltage by which an output of the power amplifier becomes a saturated state; a procedure for calculating, as a second amplitude correction value, the second amplitude coefficient at a time when an amplitude amplification factor becomes constant which is the ratio of an amplitude of the output signal to an amplitude of the input signal; and a procedure for compensating phase difference between the input signal and the output signal by using the phase correction value and controlling the amplitude amplification factor to be kept constant by using the first amplitude correction value and the second amplitude correction value.

Effect of the Invention

According to the amplifying device and the method for controlling the same of the present invention, it is possible to realize the low distortion characteristics and the highly-efficient operation of the amplifying device simultaneously.

BRIEF DESCRIPTION OF THE DRAWINGS

FIG. 4 is a sequence diagram to illustrate the operations of the amplifying device in accordance with the first exemplary embodiment of the present invention.

DESCRIPTION OF EMBODIMENTS

The exemplary embodiments of the present invention will be described with reference to drawings below.

The First Exemplary Embodiment

Figure 1:
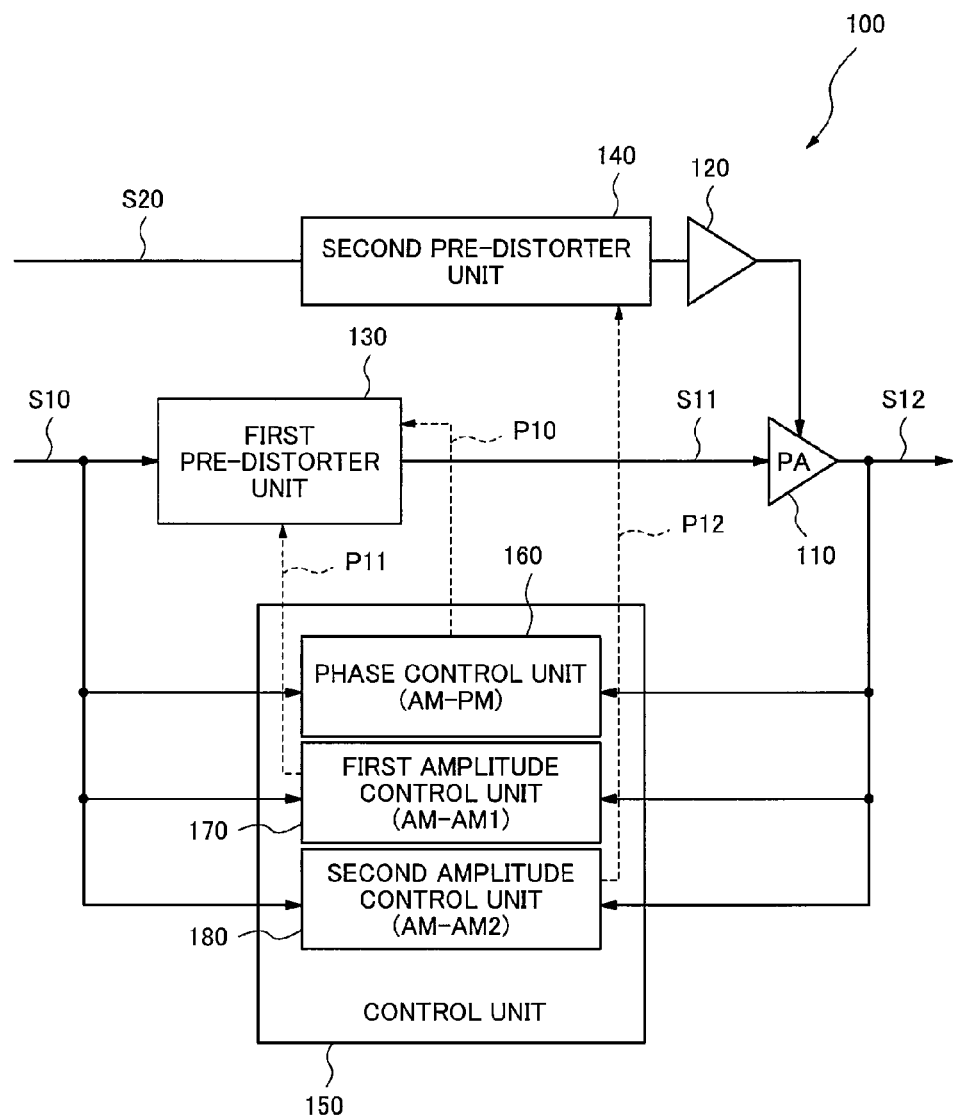
FIG. 1 is a block diagram showing a configuration of an amplifying device in accordance with the first exemplary embodiment of the present invention.

FIG. 1 is a block diagram showing a configuration of an amplifying device 100 in accordance with the first exemplary embodiment of the present invention. The amplifying device 100, which is an amplifying device with Envelope Tracking system, includes a power amplifier (PA) 110 and a power supply voltage modulation unit 120 modulating a power supply voltage of the power amplifier 110. The amplifying device 100 further includes a first pre-distorter unit 130 disposed in the preceding stage of the power amplifier 110, a second pre-distorter unit 140 disposed in the preceding stage of the power supply voltage modulation unit 120, and a control unit 150. The first pre-distorter unit 130 outputs to the power amplifier (PA) 110 a modulated signal S11 obtained by adding a phase compensation amount and an amplitude adjustment amount to an input signal S10. The second pre-distorter unit 140 obtains amplitude information S20 on the input signal of the amplifying device 100 from an input side and controls the power supply voltage modulation unit 120 on the basis of the amplitude information S20. The control unit 150 controls the operation of the first pre-distorter unit 130 and the second pre-distorter unit 140. The power amplifier 110 inputs the modulated signal S11 from the first pre-distorter unit 130 and outputs an output signal S12 which is obtained by amplifying the modulated signal S11.

The control unit 150 includes a phase control unit (AM-PM) 160, a first amplitude control unit (AM-AM1) 170, and a second amplitude control unit (AM-AM2) 180. The phase control unit (AM-PM) 160 controls the phase compensation amount in the first pre-distorter unit 130 by using a phase coefficient P10. Here, the phase compensation amount is defined as a phase amount to compensate a distortion due to the non-linearity in output phase characteristics to input amplitudes (AM-PM characteristics).

The first amplitude control unit (AM-AM1) 170 controls the amplitude adjustment amount in the first pre-distorter unit 130 by using a first amplitude coefficient P11. The second amplitude control unit (AM-AM2) 180 controls the operation of the second pre-distorter unit 140 by using a second amplitude coefficient P12. Here, the first amplitude control unit 170 cooperates with the second amplitude control unit 180 so that an amplitude amplification factor may become constant which is the ratio of the amplitude of the output signal S12 to the amplitude of the input signal S10 of the amplifying device 100. At this time, since the output amplitude characteristics to the input amplitude (AM-AM characteristics) become a linear relationship, the distortion due to non-linearity in the amplitude characteristics of the amplifying device 100 is compensated.

As mentioned above, in the amplifying device 100 of the exemplary embodiment, the first amplitude control unit 170 cooperates with the second amplitude control unit 180 to compensate the distortion in the amplitude characteristics of the amplifying device 100. That is to say, the second amplitude control unit 180 enables the power amplifier 110 to operate with high efficiency by controlling the second pre-distorter unit 140. And then, the first amplitude control unit 170 controls the first pre-distorter unit 130, so that the first pre-distorter unit 130 may output the modulated signal to compensate the distortion characteristics of the power amplifier 110 in this operating condition. As a result, according to the amplifying device 100 of the exemplary embodiment, it is possible to realize the low distortion characteristics and the highly-efficient operation simultaneously.

FIG. 1 shows the case in which the second pre-distorter unit 140 obtains the amplitude information S20 on the input signal from the input side separately from the input signal S10. However, it is not limited to this; it is also acceptable for the second pre-distorter unit 140 to obtain the amplitude information from the input signal S10 through an envelope detector.

Next, the control unit 150 in the amplifying device 100 according to the exemplary embodiment will be described in more detail. The phase control unit (AM-PM) 160 calculates, as a phase correction value, a phase coefficient at the time when the phase difference between the input signal and the output signal becomes minimized, and controls the phase compensation amount in the first pre-distorter unit 130 on the basis of the phase correction value.

Figure 2A:
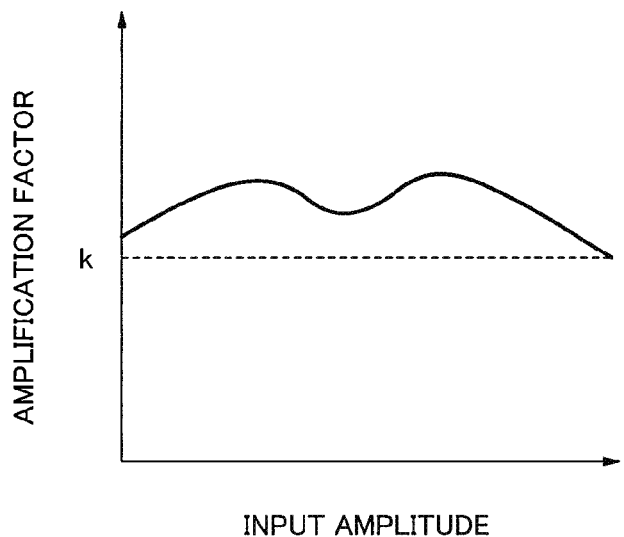
FIGS. 2A and 2B are characteristic diagrams to illustrate the operations of a control unit in the amplifying device in accordance with the first exemplary embodiment of the present invention.
Figure 2B:
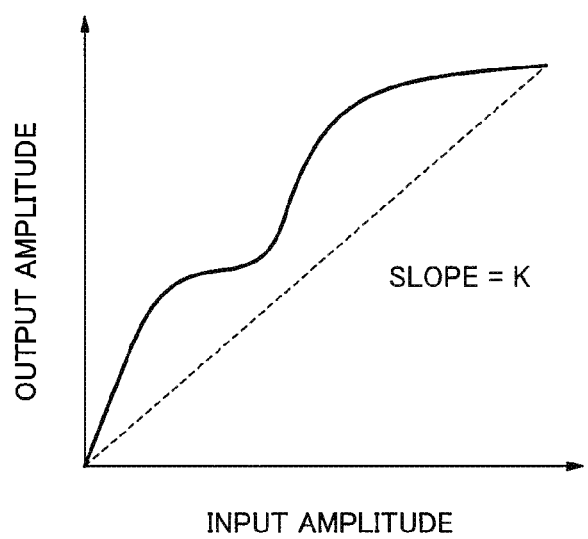

As shown in FIG. 2A, the first amplitude control unit (AM-AM1) 170 takes control so that the amplitude amplification factor in an overall range of the amplitude of the input signal may become equal to or larger than a reference amplitude amplification factor k which is an amplitude amplification factor at the time when the amplitude of the input signal is maximum. At this time, in the characteristics of the output amplitude to the input amplitude, as shown in FIG. 2B, the output amplitude in an overall range of the input amplitude becomes equal to or larger than a value on the line whose slope is equal to k (reference amplitude amplification factor). And then, the first amplitude control unit (AM-AM1) 170 calculates the first amplitude coefficient at this time as a first amplitude correction value, and controls the amplitude adjustment amount in the first pre-distorter unit 130 on the basis of the first amplitude correction value.

The second amplitude control unit (AM-AM2) 180 calculates, as a second amplitude correction value, a second amplitude coefficient at the time when the amplitude amplification factor becomes constant in an overall range of the amplitude of the input signal under the condition that the first amplitude correction value is constant. The second amplitude control unit 180 controls the operation of the second pre-distorter unit 140 on the basis of the second amplitude correction value.

Figure 3:
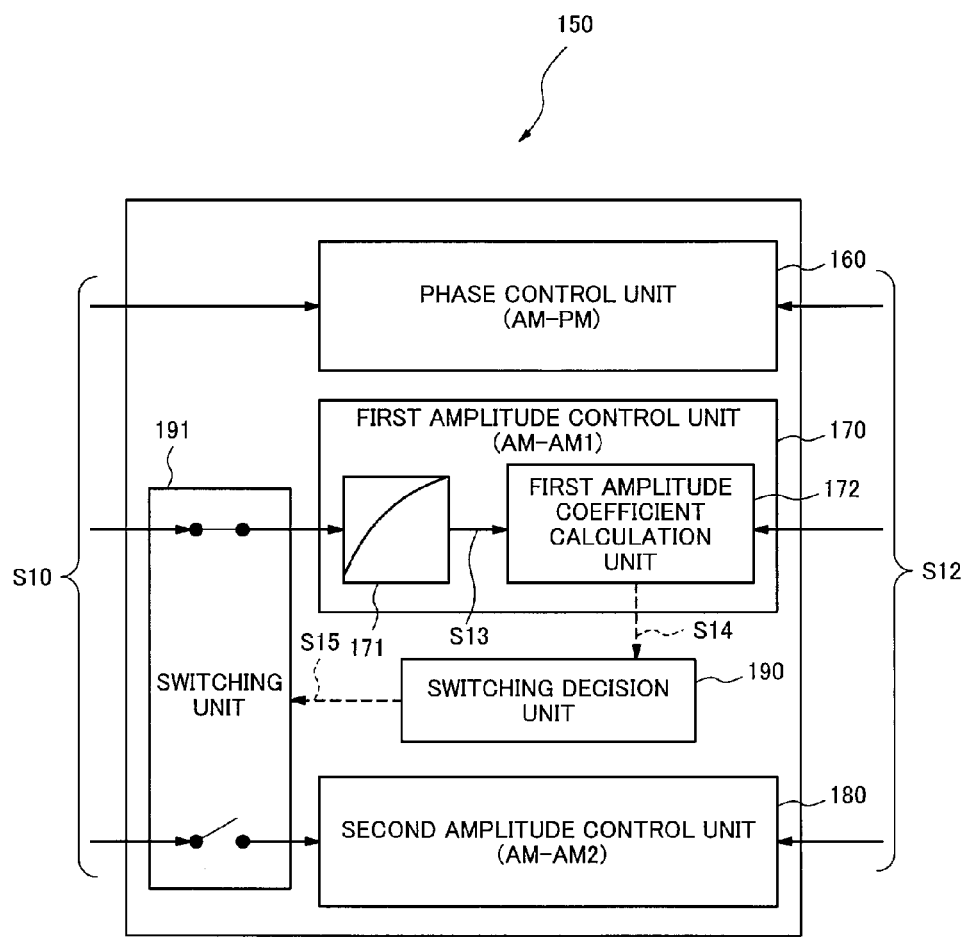
FIG. 3 is a block diagram showing a configuration of the control unit in the amplifying device in accordance with the first exemplary embodiment of the present invention.

Here, as shown in FIG. 3, it is possible to adopt a configuration in which the control unit 150 further includes a switching decision unit 190 and a switching unit 191, and the first amplitude control unit 170 includes a shaping function calculation unit 171 and a first amplitude coefficient calculation unit 172. The shaping function calculation unit 171 outputs, to the first amplitude coefficient calculation unit 172, an input modulated signal S13 which is obtained by applying a shaping function to the input signal. Here, the shaping function is a function whose output value is equal to or larger than an input value for all input values. Although a shaping function whose input/output characteristics are expressed by a convex shape will be described below as an example, it is not limited to this. The first amplitude coefficient calculation unit 172 calculates, as a first amplitude correction value, a first amplitude coefficient by which an amplitude difference between the input modulated signal S13 and the output signal S12 is minimized. At this time, the first amplitude control unit 170 controls the amplitude adjustment amount in the first pre-distorter unit 130 on the basis of the first amplitude correction value. As a result, the first pre-distorter unit 130 outputs the modulated signal S11 by which the input/output amplitude characteristics of the amplifying device 100 becomes like a convex shape determined by the shaping function.

The switching decision unit 190 obtains, from the first amplitude coefficient calculation unit 172, amplitude difference information S14 which represents the amplitude difference between the input modulated signal S13 and the output signal S12, and makes switching decision on the basis of the amplitude difference information S14. The switching unit 191 switches an operating condition of the first amplitude control unit 170 and the second amplitude control unit 180 on the basis of the result of the switching decision. Specifically, for example, when deciding that the amplitude difference exceeds a predetermined threshold value, the switching decision unit 190 outputs a switching instruction signal S15 to the switching unit 191. When the switching unit 191 receives the switching instruction signal S15, the switching unit 191 can switch the operating condition of the first amplitude control unit 170 and the operating condition of the second amplitude control unit 180.

The second amplitude control unit 180 controls the power supply voltage modulation unit 120 through the second pre-distorter unit 140. At this time, the power supply voltage modulation unit 120 controls the power supply voltage so that each output of the power amplifier 110 may become a saturated state in the overall range of the input amplitude. Specifically, the amplitude of the power supply voltage is reduced until the output of the power amplifier 110 becomes a saturated state. That is to say, the second amplitude control unit 180 calculates, as the second amplitude correction value, the second amplitude coefficient at the time when the power supply voltage modulation unit 120 supplies the power supply voltage which makes the output of the power amplifier 110 become a saturated state, and controls the operation of the second pre-distorter unit 140 on the basis of the second amplitude correction value.

Here, as mentioned above, the modulated signal S11 having the convex-shaped input/output amplitude characteristics is input into the power amplifier 110 from the first pre-distorter unit 130. Since the amplitude of the output signal S12 decreases when the output of the power amplifier 110 becomes a saturated state, it is possible to keep constant the amplitude amplification factor which is the ratio of the amplitude of the output signal S12 to the amplitude of the input signal S10, by controlling the power supply voltage by means of the above-mentioned configuration.

As mentioned above, the amplifying device 100 according to the exemplary embodiment has the configuration in which the first amplitude control unit 170 cooperates with the second amplitude control unit 180 so that the amplitude amplification factor, which is the ratio of the amplitude of the output signal to the amplitude of the input signal, may be controlled to become constant. Therefore, it becomes possible to compensate the distortion due to the non-linearity of the output amplitude to the input amplitude, under the condition that the power amplifier 110 operates with high efficiency in the saturation region.

Next, the operation of the amplifying device 100 according to the present exemplary embodiment will be described. FIG. 4 is a sequence diagram to illustrate the operations of the amplifying device 100. First, the control unit 150 initializes each coefficient of the phase control unit (AM-PM) 160, the first amplitude control unit 170, and the second amplitude control unit (AM-AM2) 180 (step S101).

At the first stage, the control unit 150 controls the operation of the first pre-distorter unit 130 by using the phase coefficient calculated by the phase control unit (AM-PM) 160 and the first amplitude coefficient calculated by the first amplitude control unit 170. That is to say, the phase coefficient determines the phase compensation amount to the input signal in the first pre-distorter unit 130, and the first amplitude coefficient determines the amplitude adjustment amount to the input signal.

The phase control unit (AM-PM) 160 synchronizes the input signal and the output signal of the amplifying device 100, and updates the phase coefficient so that the phase difference between the synchronized input and output signals may be minimized (step S102). And then, the phase correction value is calculated which is the phase coefficient to minimize the phase difference (step S103). The phase compensation amount in the first pre-distorter unit 130 is determined by the phase correction value. At this time, it is possible to use the LMS (Least Mean Square) algorithm in order to calculate the phase correction value, for example.

Figure 5A:
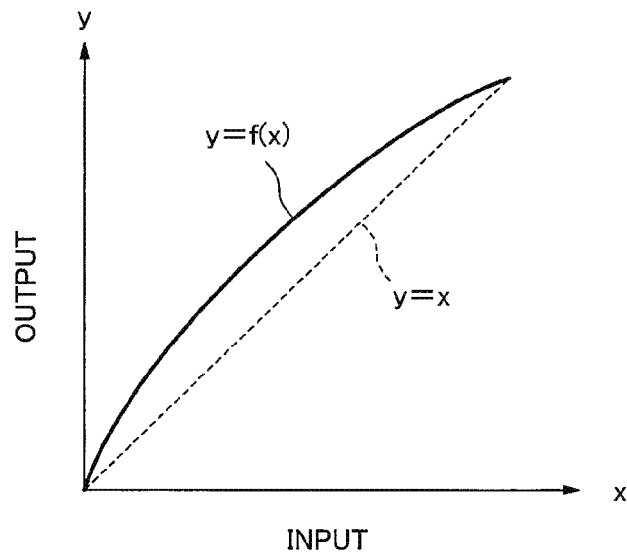
FIGS. 5A and 5B are diagrams showing input/output characteristic curves of shaping functions used in the control unit of the amplifying device in accordance with the first exemplary embodiment of the present invention.
Figure 5B:
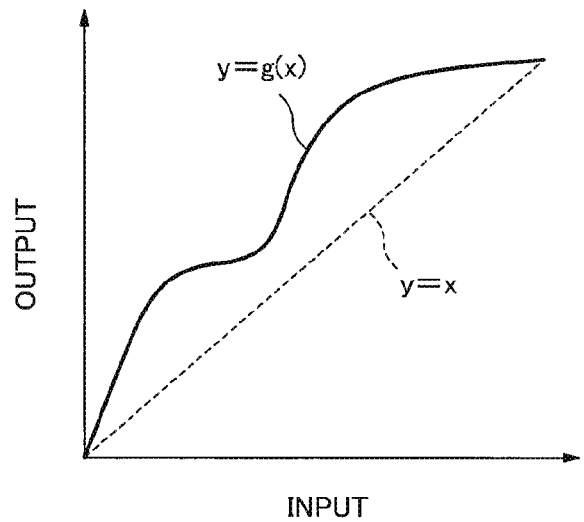

The first amplitude control unit (AM-AM1) 170 generates the input modulated signal by applying the shaping function to the input signal of the amplifying device 100, and synchronizes the input modulated signal and the output signal. The first amplitude coefficient is updated so that the amplitude difference between the input modulated signal and the output signal synchronized each other may be minimized (step S104). And then, the first amplitude correction value is calculated which is the first amplitude coefficient to minimize the amplitude difference between the input modulated signal and the output signal (step S105). The amplitude adjustment amount in the first pre-distorter unit 130 is controlled by using the first amplitude correction value so that the input/output characteristics of the amplifying device 100 may become identical with the shaping function. At this time, it is also possible to use the LMS algorithm in order to calculate the first amplitude correction value. In the present exemplary embodiment, as shown in FIG. 5A, the function (y=f(x) in the figure) is used as the shaping function which is convex upward over the straight line of y=x. However, it is not limited to this, as shown in FIG. 5B, it is possible to use as the shaping function any function which satisfies the condition that the output y is equal to or greater than every input x, that is, y≥x (y=g(x) in the figure).

When the switching decision unit 190 decides that the amplitude difference in the first amplitude control unit (AM-AM1) 170 has been at a minimum, for example, it outputs the switching instruction signal to the switching unit 191. And then, when the switching unit 191 receives the switching instruction signal, it switches the operation state of the first amplitude control unit (AM-AM1) 170 and the operation state of the second amplitude control unit (AM-AM2) 180. That is to say, the first amplitude control unit (AM-AM1) 170 is put into a stopped state (OFF) (step S106), and the second amplitude control unit (AM-AM2) 180 is put into an operating state (ON) (step S107). Accordingly, the first amplitude correction value becomes constant, and the input/output amplitude characteristics of the first pre-distorter unit 130, which are determined on the basis of the first amplitude correction value, are fixed (step S108). The switching decision unit 190 can be configured so that it may decide that the amplitude difference has been at a minimum when a value of the amplitude difference between the input modulated signal and the output signal, for example, an average value of the amplitude difference exceeds a predesignated threshold value.

At the next second stage, the second amplitude control unit (AM-AM2) 180 controls the operation of the second pre-distorter unit 140 by updating the second amplitude coefficient. That is to say, the second pre-distorter unit 140 controls the power supply voltage modulation unit 120 on the basis of the second amplitude coefficient and determines the amplitude of the power supply voltage of the power amplifier 110. Specifically, the second amplitude control unit (AM-AM2) 180 updates the second amplitude coefficient so that the power supply voltage modulation unit 120 may supply the power supply voltage by which the output of the power amplifier 110 becomes a saturated state decreasing the amplitude of power supply voltages (step S109). If the output of the power amplifier 110 becomes a saturated state, the amplitude of the output signal decreases. Therefore, it is possible to turn eventually the output signal having the convex input/output amplitude characteristics at the end of the first stage into that having the linear input/output characteristics in which the ratio of the amplitude of the output signal to the amplitude of the input signal becomes constant. The second amplitude control unit (AM-AM2) 180 calculates the second amplitude coefficient at this time as the second amplitude correction value (step S110), and controls the operation of the second pre-distorter unit 140 on the basis of the second amplitude correction value.

At the second stage, the phase control unit (AM-PM) 160 also updates the phase coefficient so that the phase difference between the input signal and the output signal may be minimized may be minimum (step S111), and calculates the phase correction value which is the phase coefficient to minimize the phase difference (step S112).

As described above, in the amplifying device 100 according to the present exemplary embodiment, the power amplifier 110 operates with high efficiency by the second amplitude control unit 180 controlling the second pre-distorter unit 140. The first amplitude control unit 170 controls the first pre-distorter unit 130 so that it may output the modulated signal which compensates the distortion characteristics of the power amplifier 110 in this operation state. In addition, the phase control unit (AM-PM) 160 constantly controls the first pre-distorter unit 130 so that the phase difference between the input signal and the output signal may be at a minimum. By means of such configuration, according to the present exemplary embodiment, it becomes possible to compensate both of the amplitude difference and the phase difference between the input signal and the output signal under the condition that the power amplifier 110 operates with high efficiency in the saturation region.

In the above-mentioned description, the amplifying device 100 has the configuration including the power amplifier 110, the power supply voltage modulation unit 120, the first pre-distorter unit 130, the second pre-distorter unit 140, and the control unit 150. Here, it is also acceptable that the first pre-distorter unit 130, the second pre-distorter unit 140, and the control unit 150 compose a control device for the power amplifier. In this case, the same effect as that of the amplifying device 100 according to the present exemplary embodiment can also be obtained by means of the configuration including the control device for the power amplifier, the power supply voltage modulation unit 120, and the power amplifier 110. The control device for the power amplifier can be implemented by an ASIC (Application Specific Integrated Circuit), for example.

It is also acceptable to make a computer execute above each step. That is to say, it is possible to make a computer execute a procedure for updating a phase coefficient determining a phase compensation amount to an input signal of an amplifying device so that a phase difference between the input signal and an output signal of the amplifying device may be minimized; a procedure for calculating a phase correction value which is a phase coefficient to minimize the phase difference; a procedure for generating an input modulated signal by applying to the input signal a function whose output value is equal to or greater than an input value for every input value; a procedure for updating a first amplitude coefficient determining an amplitude adjustment amount to the input signal so that an amplitude difference between the input modulated signal and the output signal may be minimized; a procedure for calculating a first amplitude correction value which is the first amplitude coefficient to minimize an amplitude difference between the input modulated signal and the output signal; a procedure for updating a second amplitude coefficient determining an amplitude of a power supply voltage of a power amplifier composing the amplifying device, under the condition that the first amplitude correction value is kept constant, on the basis of amplitude information on the input signal so as to supply a power supply voltage by which an output of the power amplifier becomes a saturated state; a procedure for calculating, as a second amplitude correction value, the second amplitude coefficient at a time when an amplitude amplification factor becomes constant which is the ratio of an amplitude of the output signal to an amplitude of the input signal; and a procedure for compensating phase difference between the input signal and the output signal by using the phase correction value and controlling the amplitude amplification factor to be kept constant by using the first amplitude correction value and the second amplitude correction value. In this case, it is possible to use a programmable logic calculating circuit (logic block) as the computer and implement it by means of a field programmable gate array (FPGA) and the like.

The Second Exemplary Embodiment

Figure 6:
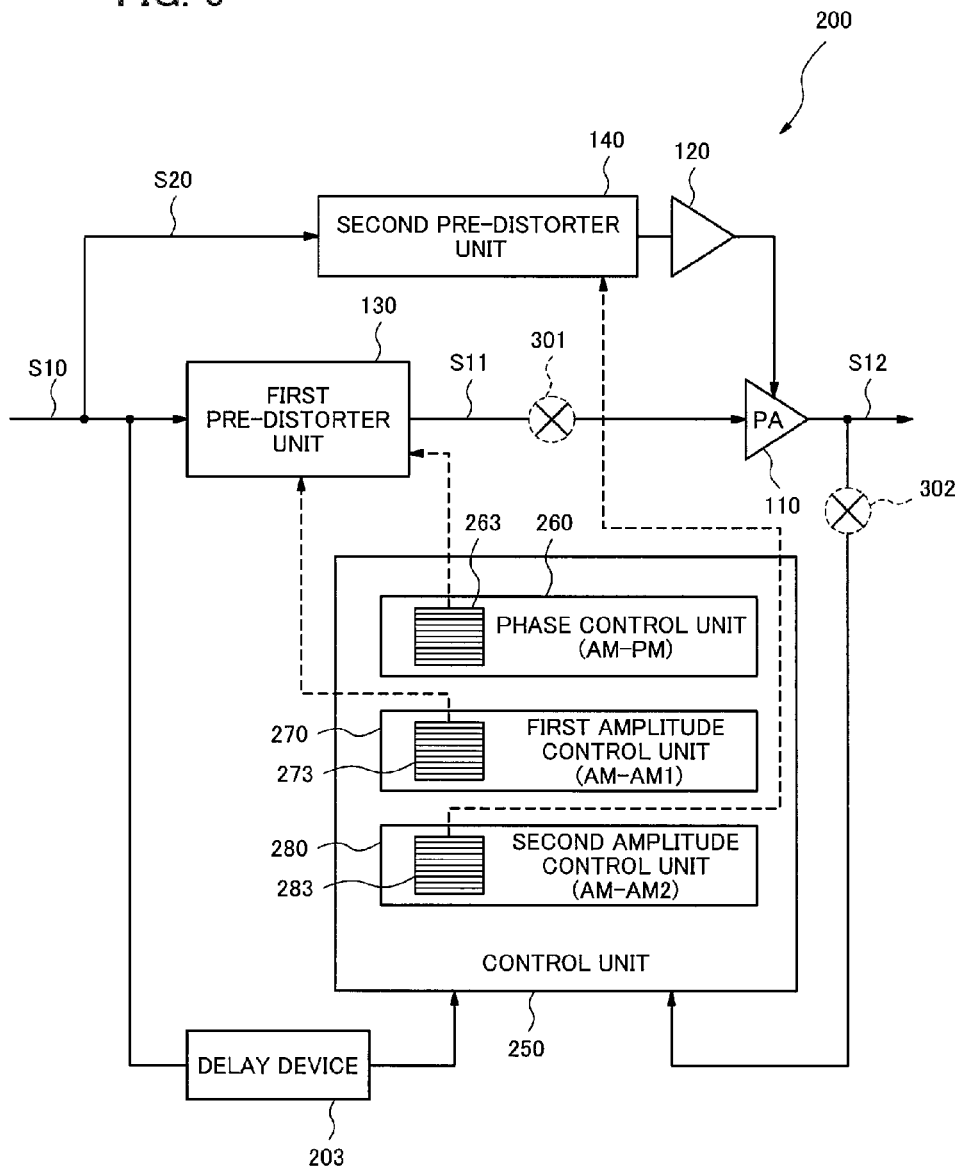
FIG. 6 is a block diagram showing a configuration of an amplifying device in accordance with the second exemplary embodiment of the present invention.

Next, the second exemplary embodiment of the present invention will be described. FIG. 6 is a block diagram showing the configuration of an amplifying device 200 in accordance with the present exemplary embodiment. The amplifying device 200, which is an amplifying device with Envelope Tracking system, includes the power amplifier (PA) 110 and the power supply voltage modulation unit 120 modulating the power supply voltage of the power amplifier 110. The amplifying device 200 further includes the first pre-distorter unit 130 disposed in the preceding stage of the power amplifier 110, the second pre-distorter unit 140 disposed in the preceding stage of the power supply voltage modulation unit 120, and a control unit 250.

The first pre-distorter unit 130 outputs to the power amplifier (PA) 110 the modulated signal S11 obtained by adding a phase compensation amount and an amplitude adjustment amount to the input signal S10. The second pre-distorter unit 140 obtains the amplitude information S20 on the input signal of the amplifying device 200 from the input side and controls the power supply voltage modulation unit 120 on the basis of the amplitude information S20. The control unit 250 controls the operation of the first pre-distorter unit 130 and the second pre-distorter unit 140. The power amplifier 110 inputs the modulated signal S11 from the first pre-distorter unit 130 and outputs the output signal S12 which is obtained by amplifying the modulated signal S11. The configuration mentioned above is similar to that of the amplifying device 100 according to the first exemplary embodiment.

In FIG. 6, a configuration is illustrated in which the second pre-distorter unit 140 obtains the amplitude information S20 from the input signal S10 through an envelope detector (not shown in the figure) and the like. And the amplifying device 200 is configured to include a delay device 203 delaying the input signal in the preceding stage of the control unit 250 in order to synchronize the input signal and the output signal of the amplifying device 200.

The amplifying device 200 according to the present exemplary embodiment differs from the amplifying device 100 according to the first exemplary embodiment in the configuration of the control unit 250. Here, the control unit 250 includes a phase control unit (AM-PM) 260, a first amplitude control unit (AM-AM1) 270, and a second amplitude control unit (AM-AM2) 280. The control unit 250 is configured to control the first pre-distorter unit 130 and the second pre-distorter unit 140 respectively by using look up tables (LUT).

That is to say, the phase control unit (AM-PM) 260 includes a first look up table 263 in which a phase coefficient to determine a phase compensation amount in the first pre-distorter unit 130 is recorded. The first amplitude control unit (AM-AM1) 270 includes a second look up table 273 in which a first amplitude coefficient to determine an amplitude adjustment amount in the first pre-distorter unit 130 is recorded. And, the second amplitude control unit (AM-AM2) 280 is configured to include a third look up table 283 in which a second amplitude coefficient to determine the operation of the second pre-distorter unit 140 is recorded.

The case will be described as an example below in which the amplifying device 200 is used for a transmission device which up-converts a baseband signal and transmits the up-converted signal. In this case, it is possible to adopt a configuration in which an up-converter 301 is disposed between the first pre-distorter unit 130 and the power amplifier (PA) 110 and a down-converter 302 is disposed between the output of the power amplifier (PA) 110 and the control unit 250.

Figure 7:
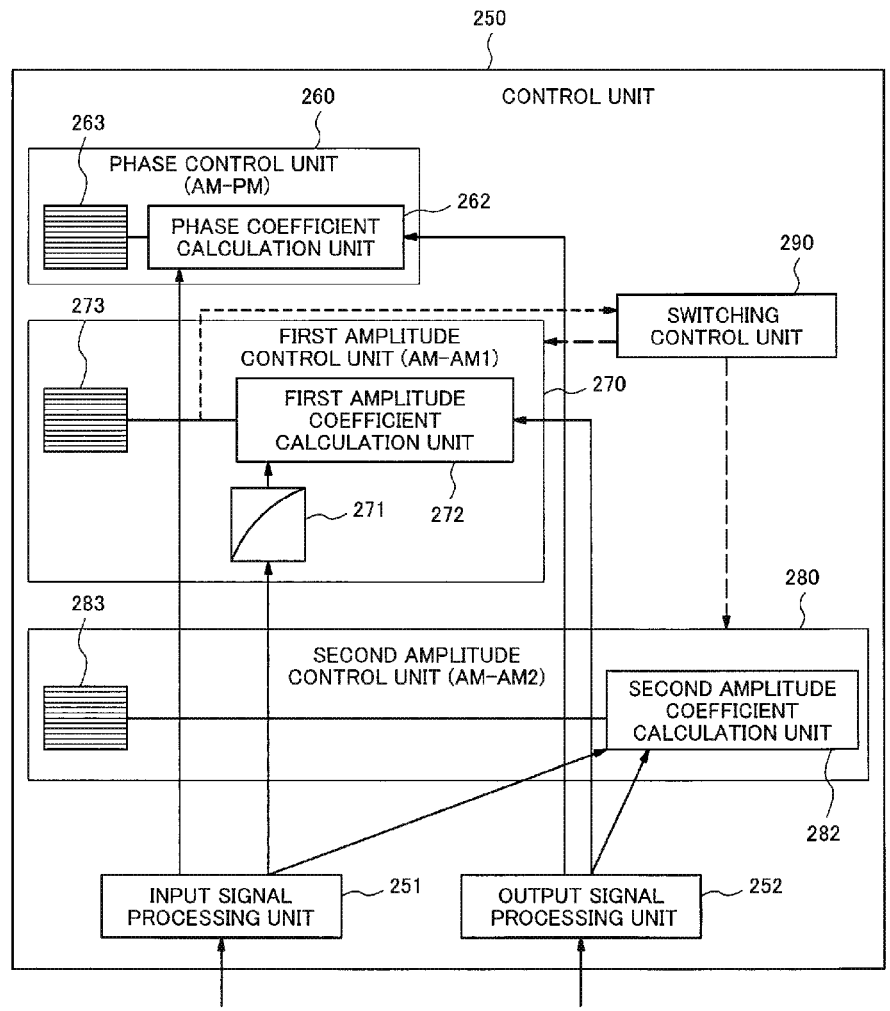
FIG. 7 is a block diagram showing a configuration of a control unit in the amplifying device in accordance with the second exemplary embodiment of the present invention.

In FIG. 7, the configuration of the control unit 250 is illustrated in more detail. The phase control unit (AM-PM) 260 includes a phase coefficient calculation unit 262 and the first look up table 263. The first amplitude control unit 270 includes a shaping function calculation unit 271, a first amplitude coefficient calculation unit 272, and the second look up table 273. And, the second amplitude control unit (AM-AM2) 280 includes a second amplitude coefficient calculation unit 282 and the third look up table 283. In addition, the control unit 250 includes an input signal processing unit 251 carrying out a scaling and an amplitude/phase separation of the input signal, an output signal processing unit 252 carrying out a scaling and an amplitude/phase separation of the output signal, and a switching control unit 290. The switching control unit 290 switches an operating condition of the first amplitude control unit 270 and an operating condition of the second amplitude control unit 280.

Next, the operation of the amplifying device 200 according to the present exemplary embodiment will be described in detail with reference to FIGS. 6 to 10. As shown in FIG. 6, the input signal S10 in baseband is modulated by the first pre-distorter unit 130, and then, up-converted by the up-converter 301 and input into the power amplifier (PA) 110. The output signal S12, which is output from the power amplifier (PA) 110 after amplification, is transmitted through an antenna. A part of the output signal S12 is attenuated by a coupler and the like, down-converted by the down-converter 302, and then input into the control unit 250.

Meanwhile, a part of the input signal S10 in baseband is input into an envelope detector (not shown in the figure) or the like, and the amplitude information S20 is extracted from the input signal S10. The second pre-distorter unit 140 controls the power supply voltage modulation unit 120 on the basis of the amplitude information S20 and the second amplitude coefficient. The power supply voltage modulation unit 120 modulates the power supply voltage of the power amplifier 110.

By delaying the input signal S10, the delay device 203 synchronizes the input signal (x(t+τ)) inputting into the control unit 250 and the output signal (y(t)). A delay amount t in the delay device 203 is obtained by calculating a correlation coefficient between the input signal and the output signal.

The control unit 250 calculates each coefficient by using the synchronized input and output signal, and updates values in each look up table. Specifically, as shown in FIG. 7, the phase coefficient calculation unit 262 calculates the phase coefficient and updates the value in the first look up table 263. The first amplitude coefficient calculation unit 272 calculates the first amplitude coefficient and updates the value in the second look up table 273. And, the second amplitude coefficient calculation unit 282 calculates the second amplitude coefficient and updates the value in the third look up table 283.

When the output value of the first amplitude coefficient calculation unit 272 falls below a predetermined threshold value, the switching control unit 290 switches the operating condition of the first amplitude control unit (AM-AM1) 270 and the operating condition of the second amplitude control unit (AM-AM2) 280. That is to say, the first amplitude control unit (AM-AM1) 270 is put into a stopped state (OFF), and the second amplitude control unit (AM-AM2) 280 is put into an operating state (ON).

The phase control unit (AM-PM) 260 determines the phase compensation amount in the first pre-distorter unit 130 by means of the phase coefficient recorded in the first look up table 263. The first amplitude control unit (AM-AM1) 270 determines the amplitude adjustment amount in the first pre-distorter unit 130 by means of the first amplitude coefficient recorded in the second look up table 273. And, the second amplitude control unit (AM-AM2) 280 determines the operation of the second pre-distorter unit 140 by means of the second amplitude coefficient recorded in the third look up table 283.

Figure 8:
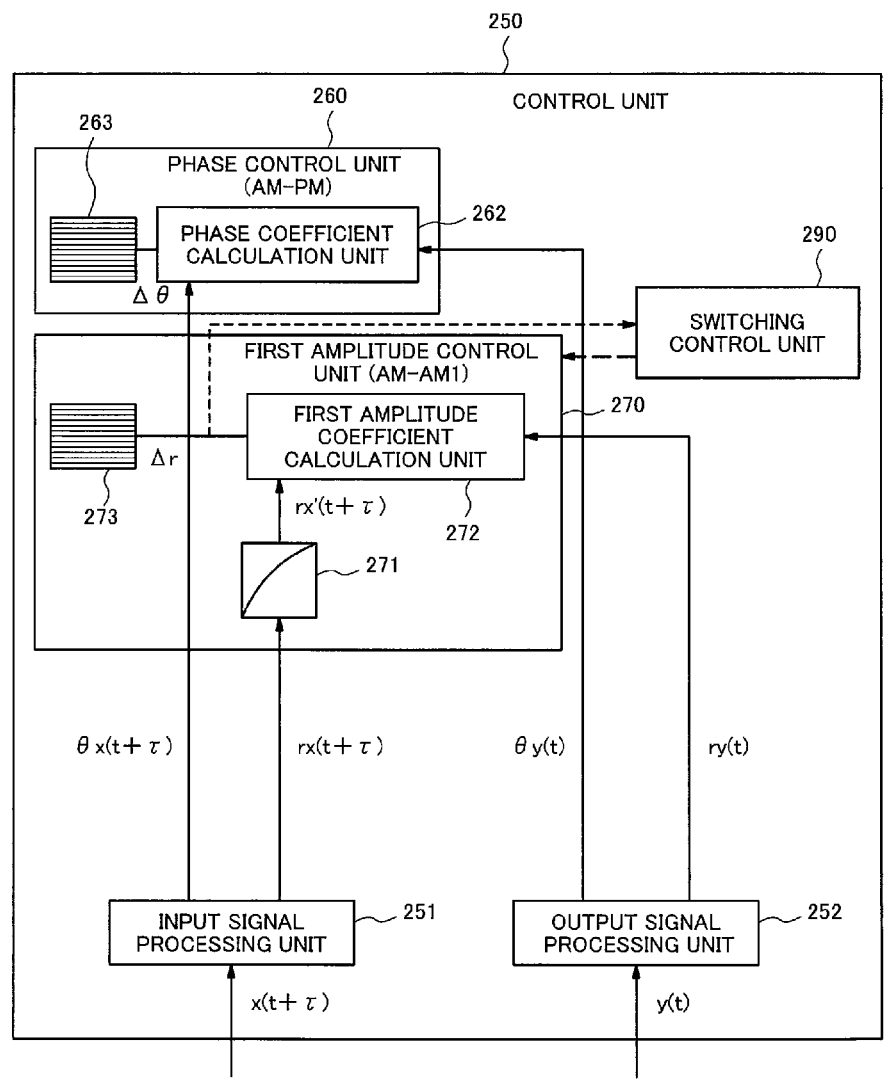
FIG. 8 is a block diagram showing a part of the configuration of the control unit in the amplifying device in accordance with the second exemplary embodiment of the present invention.
Figure 9:
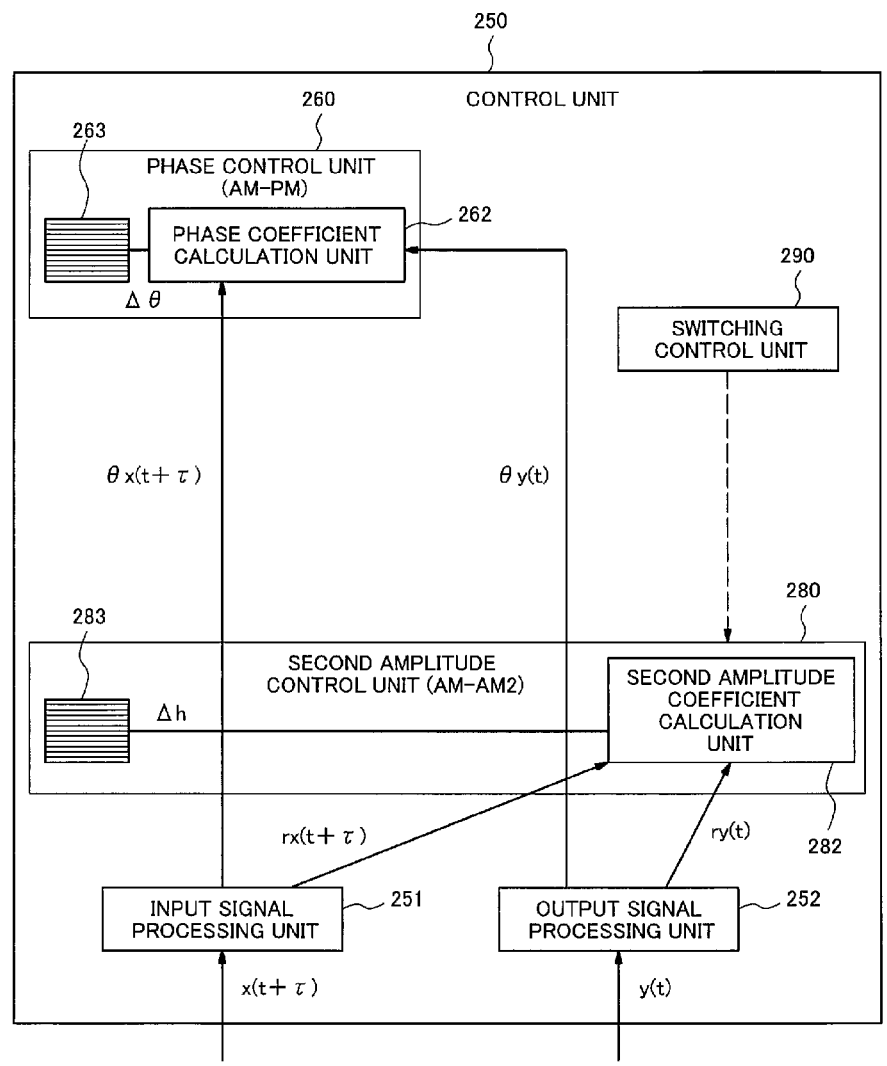
FIG. 9 is a block diagram showing another part of the configuration of the control unit in the amplifying device in accordance with the second exemplary embodiment of the present invention.
Figure 10:
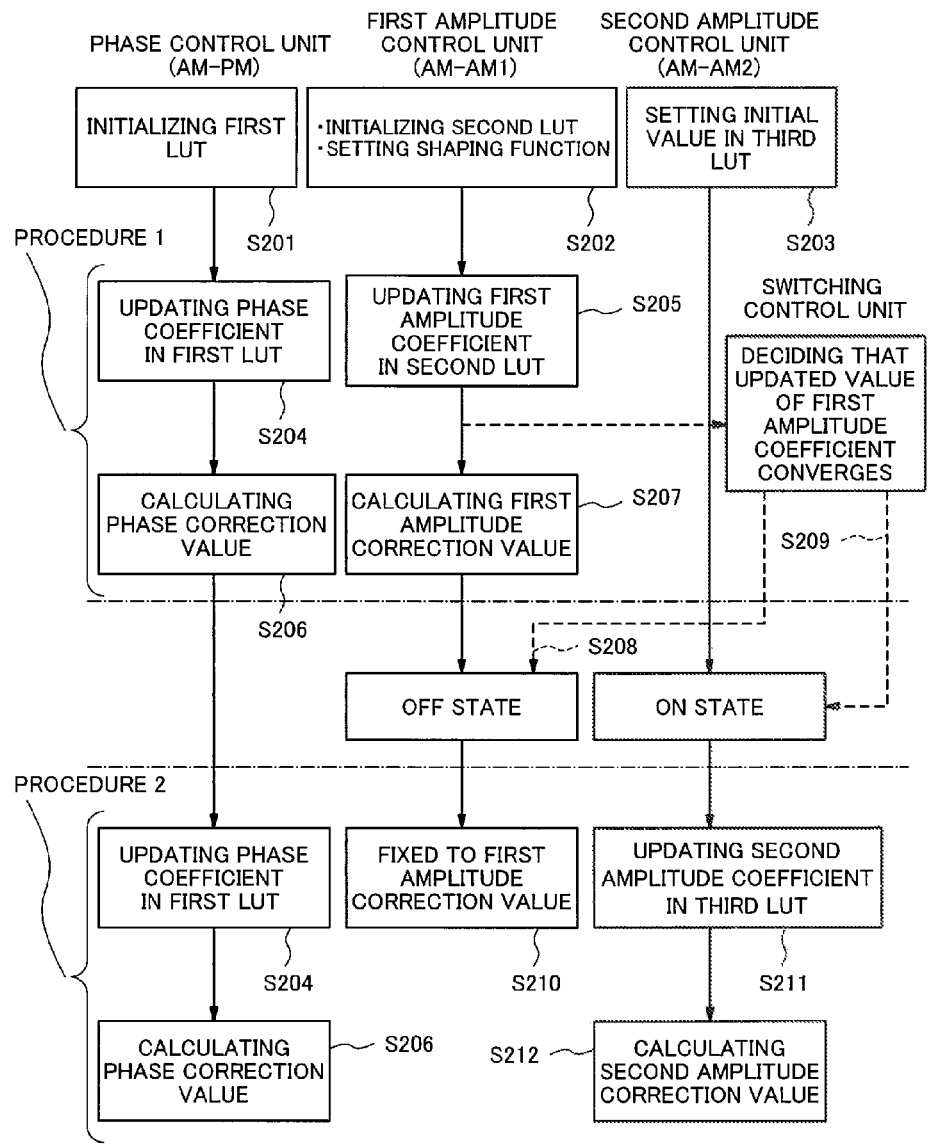
FIG. 10 is a sequence diagram to illustrate the operations of the control unit in the amplifying device in accordance with the second exemplary embodiment of the present invention.

Next, a procedure for calculating each coefficient recorded in each look up table in the control unit 250 will be described. FIG. 8 is a block diagram showing a part of the configuration of the control unit 250, corresponding to a case for controlling the first pre-distorter unit 130. FIG. 9 is a block diagram showing another part of the configuration of the control unit 250, corresponding to a case for controlling the second pre-distorter unit 140. And, FIG. 10 is a sequence diagram to illustrate the operations of the control unit 250.

First, the control unit 250 initializes each coefficient of the phase control unit (AM-PM) 260, the first amplitude control unit (AM-AM1) 270, and the second amplitude control unit (AM-AM2) 280. That is to say, in the phase control unit (AM-PM) 260, the value of the phase coefficient recorded in the first look up table (LUT) 263 is initialized (step S201 in FIG. 10). In the first amplitude control unit (AM-AM1) 270, the value of the phase coefficient recorded in the second look up table (LUT) 273 is initialized, and a predetermined shaping function is set in the shaping function calculation unit 271 (step S202). And, in the second amplitude control unit (AM-AM2) 280, an initial value for the second amplitude coefficient is set in the third look up table (LUT) 283 (step S203). The initial value at this time is set so that the output of the power amplifier 110 may not become a saturated state under the operating condition of the power amplifier 110 which is determined by the control of the second pre-distorter unit 140.

Next, with reference to FIG. 8 and FIG. 10, a procedure for updating each coefficient recorded in the first look up table 263 and the second look up table 273 which control the operation of the first pre-distorter unit 130 will be described (procedure 1 in FIG. 10).

As shown in FIG. 8, the control unit 250 includes the input signal processing unit 251 and the output signal processing unit 252. The input signal processing unit 251 and the output signal processing unit 252 scale the amplitude so that the maximum value of the amplitude may become equal to one in each baseband data stream of the input signal and the output signal for a certain time period. After being scaled, an amplitude component (r) and a phase component (θ) are separated and output respectively.

The phase coefficient calculation unit 262 performs calculations using the LMS (Least Mean Square:) algorithm so that the phase difference may be at a minimum between a phase value in the input signal (θx(t+τ)) and a phase value in the output signal (θy(t)). And then, the phase coefficient recorded in the first look up table 263 is updated by the updated value of the phase coefficient (Δθ) at this time (step S204).

Meanwhile, with respect to the amplitude component (r), first, the shaping function calculation unit 271 applies the shaping function having the convex input/output characteristics to the input signal (rx(t+τ)), and outputs an input modulated signal (rx'(t+τ)) to the first amplitude coefficient calculation unit 272. The first amplitude coefficient calculation unit 272 performs calculations using the LMS algorithm so that the amplitude difference may be at a minimum between the input modulated signal (rx'(t+τ)) and the amplitude component of the output signal (ry(t)). And then, the first amplitude coefficient recorded in the second look up table 273 is updated by the updated value of the first amplitude coefficient (Δr) at this time (step S205).

Here, as shown FIG. 5A, the function (y=f(x) in the figure) is used as the shaping function which is convex upward over the straight line of y=x, which is used in the first exemplary embodiment. That is to say, the function is used which represents a curve (y=f(x) in FIG. 5A) located upward over the straight line (y=x in FIG. 5A) which connects a point corresponding to a set of the minimum values of the input/output (0, 0) to a point corresponding to a set of the maximum values (1, 1), if each range of the input x and the output y is equal to or more than zero and less than or equal to one ([0, 1] to [0, 1]). Expressing this condition in mathematical form, the shaping function f satisfies the following numerical formulae.

$$f(0)=0, f(1)=1$$

$$f(a)>a (0<a<1)$$

Specifically, it is possible to use $y=\sin(\pi x/2)$ as the shaping function, for example.

Specifically, updating each coefficient mentioned above can be carried out as follows, for example. First, the phase coefficient calculation unit 262 and the first amplitude coefficient calculation unit 272 calculate an address value "p" of each look up table corresponding to the amplitude of the input signal (x(t+τ)) into the control unit 250. Then, the value of each look up table is updated by adding the updated values of Δθ and Δr to the values in the corresponding address "p" of the first look up table 263 and the second look up table 273 respectively.

By repeating the processing for updating the phase coefficient, the phase correction value is calculated that is a phase coefficient by which the phase difference between the input signal and the output signal of the amplifying device 200 is minimized (step S206). And, by repeating the processing for updating the first amplitude coefficient, the first amplitude correction value is calculated that is a first amplitude coefficient by which the amplitude difference between the input modulated signal and the output signal is minimized (step S207). At this time, the relation between the input modulated signal after being shaped (rx'(t+τ)) and the output signal (ry(t)) become a linear relationship. However, the relation between the input modulated signal before being shaped (rx (t+τ)) and the output signal (ry(t)) is not linear, so the output signal remains distorted at this time.

The switching control unit 290 decides whether the updated value (Δr) of the first amplitude coefficient output from the first amplitude coefficient calculation unit 272 converges. If it is decided that the updated value (Δr) has converged, the first amplitude coefficient calculation unit 272 is put into a stopped state (OFF) (step S208), and the second amplitude coefficient calculation unit 282 is put into an operating state (ON) (step S209). That is to say, the processing moves from procedure 1 to procedure 2 in FIG. 10. At this time, the first amplitude correction value becomes constant, and the input/output amplitude characteristics of the first pre-distorter unit 130, which are determined on the basis of the first amplitude correction value, are fixed (step S210). The decision of the convergence can be performed as below, for example. It is deemed that the updated value has converged if a value averaged N times of the absolute updated value (|Δr|) falls below a threshold value β. Here, N and β are parameters given beforehand.

By procedure 1 described above, the characteristics of the output phase to the input amplitude (AM-PM characteristics) of the amplifying device 200 is optimized so that the phase difference between the input signal and the output signal may be at a minimum. And, the characteristics of the output amplitude to the input amplitude (AM-AM characteristics) have come to show the similar characteristic curve to the shaping function. That is to say, at an end of procedure 1, the AM-AM characteristics remain distorted. Since an optimization process is not carried out to the power supply voltage in procedure 1, the amplifying device does not become optimum in the operating condition with respect to the efficient operation.

In calculating the first amplitude correction value mentioned above, if the LMS algorithm has not converged after a predetermined time (τ1) has passed, it is also acceptable to change the shaping function into a function more closely to the linearity and to restart the process from the initialization. Specifically, in stead of the original shaping function y=f(x), a function of y=(x+f(x))/2 can be used as a new shaping function, for example.

It is desirable for the second amplitude control unit (AM-AM2) 280 to put the power amplifier into a state just before the output saturation by controlling the second pre-distorter unit 140 after the second amplitude coefficient calculation unit 282 has been put into the operating state (ON). The condition in which the input/output characteristics of the power amplifier 110 are saturated is that the output amplitude of the power amplifier 110 becomes almost equal to the power supply voltage of the power amplifier 110. An example of specific control method in this case will be described below.

Figure 11:
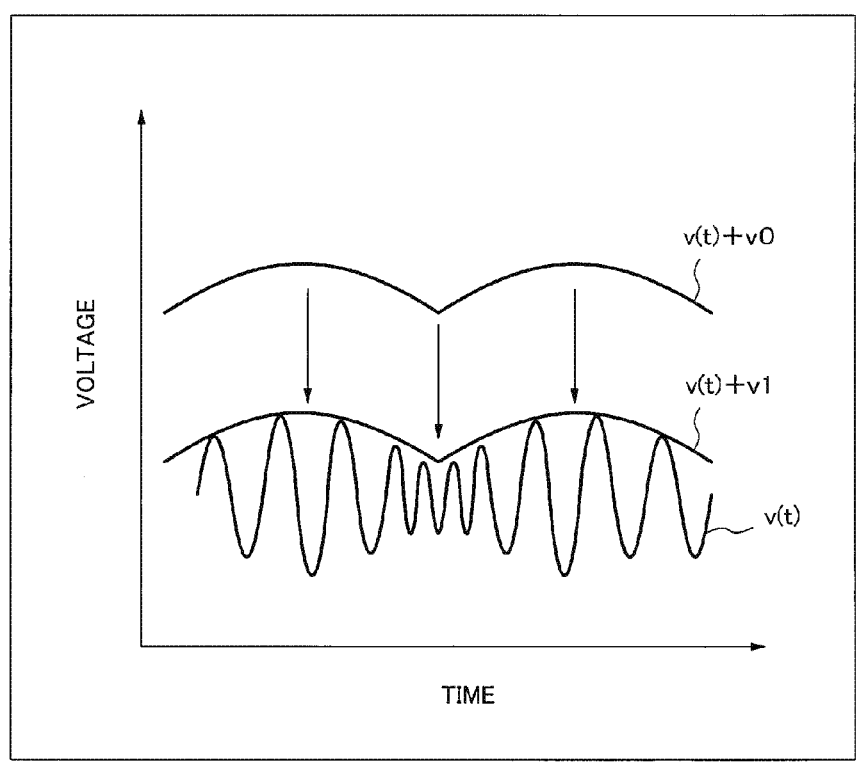
FIG. 11 is a diagram to illustrate a method for controlling a power supply voltage supplied to a power amplifier in the amplifying device in accordance with the second exemplary embodiment of the present invention.
Figure 12:
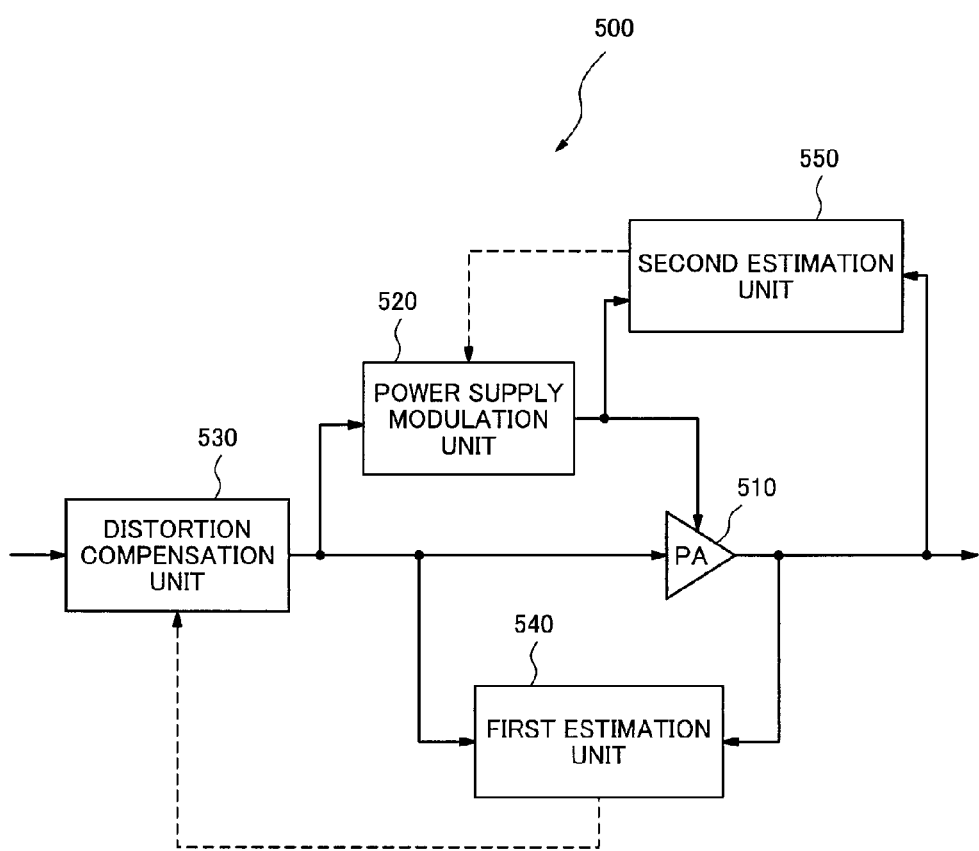
FIG. 12 is a block diagram showing a configuration of a related amplifying device.

FIG. 11 is a diagram to illustrate a method for controlling the power supply voltage supplied to the power amplifier 110, with the time on the horizontal axis and the voltage on the vertical axis. By means of the initial value of the second amplitude coefficient in the second amplitude control unit (AM-AM2) 280, the power supply voltage modulation unit 120 supplies the power amplifier 110 with an initial power supply voltage Vdd0(t). The initial power supply voltage Vdd0(t) is set so as to have a predesignated positive offset v0 large enough for the amplitude of the output signal v(t) of the power amplifier 110. That is, it is expressed as $$Vdd0(t)=v(t)+v0.$$

After the optimization of the first amplitude coefficient in above-mentioned procedure 1 has been completed, the voltage offset value v0 in the power supply voltage is decreased by controlling the power supply voltage modulation unit 120. At this time, for example, monitoring an amplification factor (gain) which is the ratio of the output signal to the input signal, the update of the voltage offset is stopped if a value of reduced gain against a range of reduced voltage offset v0 exceeds a predetermined threshold value. If the offset value at this time is represented by v1, the power supply voltage is expressed as v(t)+v1. In this way, it is possible to set the power supply voltage at the state just before the output saturation of the power amplifier 110.

Next, with reference to FIG. 9 and FIG. 10, a procedure for updating the second amplitude coefficient recorded in the third look up table 283 which controls the operation of the second pre-distorter unit 140 will be described (procedure 2 in FIG. 10). Here, since the phase control unit (AM-PM) 260 carries out the same operation as that in the procedure 1, the description of it is omitted.

FIG. 9 is a block diagram showing a part of the configuration of the control unit 250, corresponding to a case for controlling the second pre-distorter unit 140. The second amplitude coefficient calculation unit 282 updates the second amplitude coefficient recorded in the third look up table (LUT) 283 by the updated value of the second amplitude coefficient (Δh) (step S211). At this time, the second amplitude coefficient calculation unit 282 updates the second amplitude coefficient so that the AM-AM characteristics in a distorted state at the end of procedure 1 may approach the linearity. That is to say, the power amplifier 110 is put into a state of the output saturation by attenuating the corresponding power supply voltage to the input amplitude having AM-AM characteristics without a linear relationship, by which the power amplifier 110 is controlled so that the output amplitude may decrease.

Specifically, for example, it is possible to put the power amplifier 110 into an output saturated state by reducing the value in the third look up table (LUT) 283 corresponding to the input amplitude rx(t) in proportion to a difference value from the linearity (ry(t)−rx(t)). That is to say, the updated value (Δh(t)) corresponding to rx(t) is determined by the following formula.

$$\Delta h(t)=-\alpha(ry(t)-rx(t))$$

Where α is a value given beforehand. It is possible to update the second amplitude coefficient by means of calculating an address value corresponding to the amplitude of the input signal (x(t+τ)), and adding the updated value Δh to a value in the corresponding address value in the third look up table (LUT) 283, for example.

In this way, by repeating the processing for updating the second amplitude coefficient, it is possible to put the power amplifier 110 into the saturation state at each of the output amplitude. As a result, since the corresponding output amplitude is attenuated for each of the input amplitude, it is possible to move the AM-AM characteristics having the convex input/output characteristics at the end of the procedure 1 closer to the linear characteristics. And then, the second amplitude coefficient calculation unit 282 calculates, as the second amplitude correction value, a second amplitude coefficient at the time when the amplitude amplification factor, that is, the ratio of the amplitude of the output signal to the amplitude of the input signal, becomes constant over the entire range of the amplitude of the input signal (step S212). As a result, it is possible to obtain the low-distortion output signal in which both of the amplitude component and the phase component are corrected, in addition to the highly-efficient amplification operation utilizing the region where the input/output characteristics of the power amplifier 110 are saturated.

As described above, in the amplifying device 200 according to the present exemplary embodiment, the power amplifier 110 operates with high efficiency by the second amplitude control unit 280 controlling the second pre-distorter unit 140. The first amplitude control unit 270 controls the first pre-distorter unit 130 so that it may output the modulated signal which compensates the distortion characteristics of the power amplifier 110 in this operation state. In addition, the phase control unit (AM-PM) 260 constantly controls the first pre-distorter unit 130 so that the phase difference between the input signal and the output signal may be at a minimum. By means of such configuration, according to the present exemplary embodiment, it becomes possible to compensate both of the amplitude difference and the phase difference between the input signal and the output signal under the condition that the power amplifier 110 operates with high efficiency in the saturation region.

Since the optimization of the second pre-distorter unit 140 according to the present exemplary embodiment is carried out by reducing the second amplitude coefficient, the calculation amount is small and the convergence time of the algorithm is short. Therefore, according to the present exemplary embodiment, the effect can be obtained that it is possible to optimize the amplifying device rapidly. In addition, according to the present exemplary embodiment, since the power amplifier operates in the saturation region, it is able to operate with higher efficiency than the related amplifying device.

The method for updating the coefficient recorded in the third look up table (LUT) 283 is not limited to the above-mentioned method. Another linearization method is also applicable such as a method for reducing a coefficient recorded in the near address simultaneously in order to keep the continuity of the look up table.

It is also acceptable to repeat the above-mentioned processing for updating the second amplitude coefficient until the distortion of the amplifying device 200 satisfies a predetermined standard value. For example, it is possible to repeat the processing until the adjacent-channel power ratio (ACPR) becomes equal to or less than −40 dB.

In calculating the second amplitude correction value mentioned above, if the distortion does not satisfy the predetermined standard value even after a predetermined time ($\tau 2$) has passed, it is thought that the influence of the distortion due to the output saturation is significant. Accordingly, it is also acceptable to change the shaping function into a function more closely to the linearity in order to relax the output saturation and to restart the process from the initialization. In this case, as is the case with procedure 1, it is possible to use a function of $y=(x+f(x))/2$ as a new shaping function in stead of the original shaping function $y=f(x)$, for example.

In the present exemplary embodiment, the case is described in which the look up table (LUT) method is used as the pre-distorter. However, it is not limited to this. It is also acceptable to use a pre-distorter employing a method for approximating a distortion correction amount by means of polynomial equations, or a method for performing computer processing by means of complex signals.

In the above-mentioned description, the amplifying device 200 has the configuration including the power amplifiers 110, the power supply voltage modulation unit 120, the first pre-distorter unit 130, the second pre-distorter unit 140, and the control unit 250. Here, it is also acceptable that the first pre-distorter unit 130, the second pre-distorter unit 140, and the control unit 250 compose a control device for the power amplifier. In this case, the same effect as that of the amplifying device 200 according to the present exemplary embodiment can also be obtained by means of the configuration including the control device for the power amplifier, the power supply voltage modulation unit 120, and the power amplifier 110. The control device for the power amplifier can be implemented by an FPGA (Field Programmable Gate Array) or the like.

The present invention is not limited to the above-mentioned exemplary embodiments and can be variously modified within the scope of the invention described in the claims. It goes without saying that these modifications are also included in the scope of the present invention.

This application is based upon and claims the benefit of priority from Japanese Patent Application No. 2010-283133, filed on Dec. 20, 2010, the disclosure of which is incorporated herein in its entirety by reference.

DESCRIPTION OF THE CODES 100, 200 amplifying device
110 power amplifier
120 power supply voltage modulation unit
130 first pre-distorter unit
140 second pre-distorter unit
150, 250 control unit
160, 260 phase control unit (AM-PM)
170, 270 first amplitude control unit (AM-AM1)
171, 271 shaping function calculation unit
172, 272 first amplitude coefficient calculation unit
180, 280 second amplitude control unit (AM-AM2)
190 switching decision unit
191 switching unit
203 delay device
251 input signal processing unit
252 output signal processing unit
262 phase coefficient calculation unit
263 first look up table
273 second look up table
282 second amplitude coefficient calculation unit
283 third look up table
290 switching control unit
301 up-converter
302 down-converter
500 related amplifying device
510 power amplifier
520 power supply modulation unit
530 distortion compensation unit
540 first estimation unit
550 second estimation unit
S10 input signal
S11 modulated signal
S12 output signal
S13 input modulated signal
S14 amplitude difference information
S15 switching instruction signal
S20 amplitude information
P10 phase coefficient
P11 first amplitude coefficient
P12 second amplitude coefficient

What is claimed is:
1. An amplifying device, comprising:
a first pre-distorter unit outputting a modulated signal obtained by adding a phase compensation amount and an amplitude adjustment amount to an input signal;
a power amplifier inputting the modulated signal and outputting an output signal obtained by amplifying the modulated signal;
a power supply voltage modulation unit modulating a power supply voltage of the power amplifier;
a second pre-distorter unit controlling the power supply voltage modulation unit on the basis of amplitude information on the input signal; and
a control unit controlling an operation of the first pre-distorter unit and the second pre-distorter unit;

wherein the control unit comprises
a phase control unit controlling the phase compensation amount by using a phase coefficient,
a first amplitude control unit controlling the amplitude adjustment amount by using a first amplitude coefficient, and
a second amplitude control unit controlling the operation of the second pre-distorter unit by using a second amplitude coefficient; and
wherein the first amplitude control unit cooperates with the second amplitude control unit so that an amplitude amplification factor may become constant which is a ratio of an amplitude of the output signal to an amplitude of the input signal.

2. The amplifying device according to claim 1,
wherein the phase control unit calculates, as a phase correction value, the phase coefficient at the time when a phase difference between the input signal and the output signal becomes minimized;
the first amplitude control unit calculates, as a first amplitude correction value, the first amplitude coefficient at the time when the amplitude amplification factor in an overall range of the amplitude of the input signal is equal to or larger than a reference amplitude amplification factor which is an amplitude amplification factor at the time when an amplitude of the input signal is maximum; and
the second amplitude control unit calculates, as a second amplitude correction value, the second amplitude coefficient at the time when the amplitude amplification factor becomes constant in an overall range of the amplitude of the input signal under the condition that the first amplitude correction value is constant.

3. The amplifying device according to claim 2,
wherein the first amplitude control unit comprises a shaping function calculation unit and a first amplitude coefficient calculation unit,
wherein the shaping function calculation unit outputs, to the first amplitude coefficient calculation unit, an input modulated signal which is obtained by applying, to the input signal, a shaping function which is a function whose output value is equal to or larger than an input value for all input values; and
the first amplitude coefficient calculation unit calculates, as the first amplitude correction value, a first amplitude coefficient by which an amplitude difference between the input modulated signal and the output signal is minimized.

4. The amplifying device according to claim 3, further comprising
a switching decision unit obtaining, from the first amplitude coefficient calculation unit, amplitude difference information which represents an amplitude difference between the input modulated signal and the output signal, and making switching decision on the basis of the amplitude difference information; and
a switching unit switching an operating condition of the first amplitude control unit and an operating condition of the second amplitude control unit on the basis of a result of the switching decision.

5. The amplifying device according to claim 2,
wherein the second amplitude control unit calculates, as a second amplitude correction value, the second amplitude coefficient at the time when the power supply voltage modulation unit supplies a power supply voltage which makes an output of the power amplifier become a saturated state.

6. The amplifying device according to claim 1,
wherein the phase control unit comprises a first look up table in which the phase coefficient to determine a phase compensation amount in the first pre-distorter unit is recorded;
the first amplitude control unit comprises a second look up table in which the first amplitude coefficient to determine an amplitude adjustment amount in the first pre-distorter unit is recorded; and
the second amplitude control unit comprises a third look up table in which the second amplitude coefficient to determine an operation of the second pre-distorter unit is recorded.

7. A control device for a power amplifier comprising a power supply voltage modulation unit modulating a power supply voltage, comprising:
a first pre-distorter unit outputting, to the power amplifier, a modulated signal obtained by adding a phase compensation amount and an amplitude adjustment amount to an input signal;
a second pre-distorter unit controlling the power supply voltage modulation unit on the basis of amplitude information on the input signal; and
a control unit controlling an operation of the first pre-distorter unit and the second pre-distorter unit;
wherein the control unit comprises
a phase control unit controlling the phase compensation amount by using a phase coefficient,
a first amplitude control unit controlling the amplitude adjustment amount by using a first amplitude coefficient, and
a second amplitude control unit controlling the operation of the second pre-distorter unit by using a second amplitude coefficient; and
wherein the first amplitude control unit cooperates with the second amplitude control unit so that an amplitude amplification factor may become constant which is a ratio of an amplitude of an output signal of the power amplifier to an amplitude of the input signal.

8. A method for controlling an amplifying device, comprising the steps of:
updating a phase coefficient determining a phase compensation amount to an input signal of an amplifying device so that a phase difference between the input signal and an output signal of the amplifying device may be minimized;
calculating a phase correction value which is a phase coefficient to minimize the phase difference;
generating an input modulated signal by applying to the input signal a function whose output value is equal to or greater than an input value for every input value;
updating a first amplitude coefficient determining an amplitude adjustment amount to the input signal so that an amplitude difference between the input modulated signal and the output signal may be minimized;
calculating a first amplitude correction value which is the first amplitude coefficient to minimize an amplitude difference between the input modulated signal and the output signal;
updating a second amplitude coefficient determining an amplitude of a power supply voltage of a power amplifier composing the amplifying device, under the condition that the first amplitude correction value is kept constant, on the basis of amplitude information on the input signal so as to supply a power supply voltage by which an output of the power amplifier becomes a saturated state;

calculating, as a second amplitude correction value, the second amplitude coefficient at a time when an amplitude amplification factor becomes constant which is the ratio of an amplitude of the output signal to an amplitude of the input signal; and compensating phase difference between the input signal and the output signal by using the phase correction value and controlling the amplitude amplification factor to be kept constant by using the first amplitude correction value and the second amplitude correction value.

9. The method for controlling an amplifying device according to claim 8, further comprising:
stopping updating the first amplitude coefficient and starting to update the second amplitude coefficient, when the amplitude difference between the input modulated signal and the output signal being at a minimum.

10. The method for controlling an amplifying device according to claim 8,
wherein a least mean square algorithm is used in calculating the phase correction value.

11. The method for controlling an amplifying device according to any one of claim 8,
wherein a least mean square algorithm is used in calculating the first amplitude correction value.

12. A non-transitory computer-readable recording medium storing a program which makes a computer execute a procedure for updating a phase coefficient determining a phase compensation amount to an input signal of an amplifying device so that a phase difference between the input signal and an output signal of the amplifying device may be minimized;
a procedure for calculating a phase correction value which is a phase coefficient to minimize the phase difference;
a procedure for generating an input modulated signal by applying to the input signal a function whose output value is equal to or greater than an input value for every input value;
a procedure for updating a first amplitude coefficient determining an amplitude adjustment amount to the input signal so that an amplitude difference between the input modulated signal and the output signal may be minimized;
a procedure for calculating a first amplitude correction value which is the first amplitude coefficient to minimize an amplitude difference between the input modulated signal and the output signal;
a procedure for updating a second amplitude coefficient determining an amplitude of a power supply voltage of a power amplifier composing the amplifying device, under the condition that the first amplitude correction value is kept constant, on the basis of amplitude information on the input signal so as to supply a power supply voltage by which an output of the power amplifier becomes a saturated state;
a procedure for calculating, as a second amplitude correction value, the second amplitude coefficient at a time when an amplitude amplification factor becomes constant which is the ratio of an amplitude of the output signal to an amplitude of the input signal; and
a procedure for compensating phase difference between the input signal and the output signal by using the phase correction value and controlling the amplitude amplification factor to be kept constant by using the first amplitude correction value and the second amplitude correction value.

13. The amplifying device according to claim 3,
wherein the second amplitude control unit calculates, as a second amplitude correction value, the second amplitude coefficient at the time when the power supply voltage modulation unit supplies a power supply voltage which makes an output of the power amplifier become a saturated state.

14. The amplifying device according to claim 4,
wherein the second amplitude control unit calculates, as a second amplitude correction value, the second amplitude coefficient at the time when the power supply voltage modulation unit supplies a power supply voltage which makes an output of the power amplifier become a saturated state.

15. The amplifying device according to claim 2,
wherein the phase control unit comprises a first look up table in which the phase coefficient to determine a phase compensation amount in the first pre-distorter unit is recorded;
the first amplitude control unit comprises a second look up table in which the first amplitude coefficient to determine an amplitude adjustment amount in the first pre-distorter unit is recorded; and
the second amplitude control unit comprises a third look up table in which the second amplitude coefficient to determine an operation of the second pre-distorter unit is recorded.

16. The amplifying device according to claim 3,
wherein the phase control unit comprises a first look up table in which the phase coefficient to determine a phase compensation amount in the first pre-distorter unit is recorded;
the first amplitude control unit comprises a second look up table in which the first amplitude coefficient to determine an amplitude adjustment amount in the first pre-distorter unit is recorded; and
the second amplitude control unit comprises a third look up table in which the second amplitude coefficient to determine an operation of the second pre-distorter unit is recorded.

17. The amplifying device according to claim 4,
wherein the phase control unit comprises a first look up table in which the phase coefficient to determine a phase compensation amount in the first pre-distorter unit is recorded;
the first amplitude control unit comprises a second look up table in which the first amplitude coefficient to determine an amplitude adjustment amount in the first pre-distorter unit is recorded; and
the second amplitude control unit comprises a third look up table in which the second amplitude coefficient to determine an operation of the second pre-distorter unit is recorded.

18. The amplifying device according to claim 5,
wherein the phase control unit comprises a first look up table in which the phase coefficient to determine a phase compensation amount in the first pre-distorter unit is recorded;
the first amplitude control unit comprises a second look up table in which the first amplitude coefficient to determine an amplitude adjustment amount in the first pre-distorter unit is recorded; and
the second amplitude control unit comprises a third look up table in which the second amplitude coefficient to determine an operation of the second pre-distorter unit is recorded.

19. The method for controlling an amplifying device according to claim 9,
wherein a least mean square algorithm is used in calculating the phase correction value.

20. The method for controlling an amplifying device according to claim 9,
   wherein a least mean square algorithm is used in calculating the first amplitude correction value.

* * * * *